(12) United States Patent
Taniguchi et al.

(10) Patent No.: US 11,942,921 B2
(45) Date of Patent: Mar. 26, 2024

(54) ACOUSTIC WAVE DEVICE

(71) Applicant: Murata Manufacturing Co., Ltd., Nagaokakyo (JP)

(72) Inventors: Yasumasa Taniguchi, Nagaokakyo (JP); Katsuya Daimon, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 456 days.

(21) Appl. No.: 17/340,182

(22) Filed: Jun. 7, 2021

(65) Prior Publication Data
US 2021/0297061 A1 Sep. 23, 2021

Related U.S. Application Data

(63) Continuation of application No. PCT/JP2019/048053, filed on Dec. 9, 2019.

(30) Foreign Application Priority Data

Dec. 10, 2018 (JP) .................. 2018-230836

(51) Int. Cl.
*H03H 9/145* (2006.01)
*H03H 9/02* (2006.01)
*H03H 9/25* (2006.01)

(52) U.S. Cl.
CPC ........ *H03H 9/145* (2013.01); *H03H 9/02007* (2013.01); *H03H 9/02535* (2013.01); *H03H 9/25* (2013.01)

(58) Field of Classification Search
CPC ............... H03H 9/145; H03H 9/02007; H03H 9/02535; H03H 9/25; H03H 9/02834; H03H 9/02574

(Continued)

(56) References Cited

U.S. PATENT DOCUMENTS

2012/0038244 A1 2/2012 Wada et al.
2018/0159497 A1 6/2018 Iwamoto et al.
(Continued)

FOREIGN PATENT DOCUMENTS

CN 107925397 A 4/2018
JP 2001-196894 A 7/2001
(Continued)

OTHER PUBLICATIONS

Office Action in CN201980081386.4, dated Aug. 31, 2023, 6 pages.
Official Communication issued in International Patent Application No. PCT/JP2019/048053, dated Jan. 28, 2020.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

In an acoustic wave device, an IDT electrode is located on a piezoelectric layer. A high-acoustic-velocity member is positioned on an opposite side of the piezoelectric layer from the IDT electrode. An acoustic velocity of a bulk wave propagating through the high-acoustic-velocity member is higher than an acoustic velocity of an acoustic wave propagating through the piezoelectric layer. A low-acoustic-velocity film is provided between the high-acoustic-velocity member and the piezoelectric layer. An acoustic velocity of a bulk wave propagating through the low-acoustic-velocity film is lower than the acoustic velocity of the bulk wave propagating through the piezoelectric layer. A dielectric film is located on the piezoelectric layer so as to cover the IDT electrode. In the acoustic wave device, a Young's modulus of the dielectric film is larger than a Young's modulus of the low-acoustic-velocity film.

9 Claims, 2 Drawing Sheets

(58) Field of Classification Search
USPC .......................................... 333/133, 193–196
See application file for complete search history.

(56) References Cited

U.S. PATENT DOCUMENTS

2018/0316333 A1   11/2018  Nakamura et al.
2021/0359660 A1*  11/2021  Tanno ................ H03H 9/02551

FOREIGN PATENT DOCUMENTS

| | | |
|---|---|---|
| JP | 2008-301066 A | 12/2008 |
| JP | 2011-130006 A | 6/2011 |
| JP | 2012-065304 A | 3/2012 |
| JP | 2018-191112 A | 11/2018 |
| WO | 2017/043427 A1 | 3/2017 |

* cited by examiner

ACOUSTIC WAVE DEVICE

CROSS REFERENCE TO RELATED APPLICATIONS

This application claims the benefit of priority to Japanese Patent Application No. 2018-230836 filed on Dec. 10, 2018 and is a Continuation Application of PCT Application No. PCT/JP2019/048053 filed on Dec. 9, 2019. The entire contents of each application are hereby incorporated herein by reference.

BACKGROUND OF THE INVENTION

1. Field of the Invention

The present invention relates to acoustic wave devices. More specifically, the present invention relates to an acoustic wave device including a dielectric film and a low-acoustic-velocity film.

2. Description of the Related Art

Conventionally, an acoustic wave device is known in which a dielectric film is disposed so as to cover an IDT electrode (for example, refer to International Publication No. 2017/043427).

The acoustic wave device described in International Publication No. 2017/043427 has a high-acoustic-velocity support substrate as a high-acoustic-velocity member. On the high-acoustic-velocity support substrate, a low-acoustic-velocity film with a relatively low acoustic velocity is disposed. Also, a piezoelectric film is disposed on the low-acoustic-velocity film. On an upper surface of this piezoelectric film, the IDT electrode is disposed. Furthermore, the dielectric film is disposed so as to cover the IDT electrode.

SUMMARY OF THE INVENTION

In the acoustic wave device described in International Publication No. 2017/043427, acoustic wave energy concentrates not only on the piezoelectric film (piezoelectric layer) but also on the dielectric film, and therefore loss of acoustic wave energy may be increased.

Preferred embodiments of the present invention provide acoustic wave devices in each of which loss of acoustic wave energy is reduced or prevented.

An acoustic wave device according to an aspect of a preferred embodiment of the present invention includes a piezoelectric layer, an IDT electrode, a high-acoustic-velocity member, a low-acoustic-velocity film, and a dielectric film. The IDT electrode is located on the piezoelectric layer. The high-acoustic-velocity member is positioned on an opposite side of the piezoelectric layer from the IDT electrode. An acoustic velocity of a bulk wave propagating through the high-acoustic-velocity member is higher than an acoustic velocity of an acoustic wave propagating through the piezoelectric layer. The low-acoustic-velocity film is provided between the high-acoustic-velocity member and the piezoelectric layer. An acoustic velocity of a bulk wave propagating through the low-acoustic-velocity film is lower than the acoustic velocity of the bulk wave propagating through the piezoelectric layer. The dielectric film is located on the piezoelectric layer so as to cover the IDT electrode. A Young's modulus of the dielectric film is larger than a Young's modulus of the low-acoustic-velocity film.

According to preferred embodiments of the present invention, it is possible to reduce or prevent loss of acoustic wave energy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
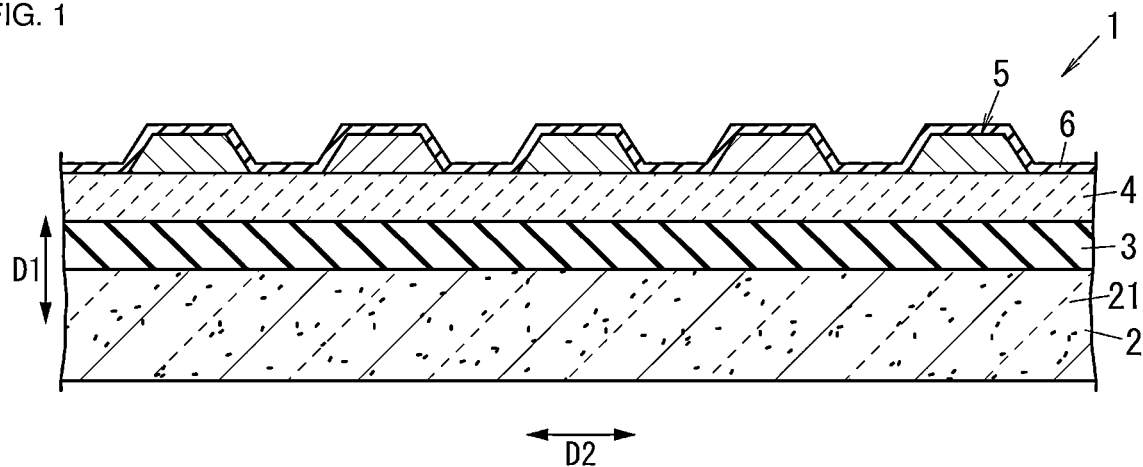
FIG. 1 is a sectional view of an acoustic wave device according to a preferred embodiment of the present invention.
Figure 3:
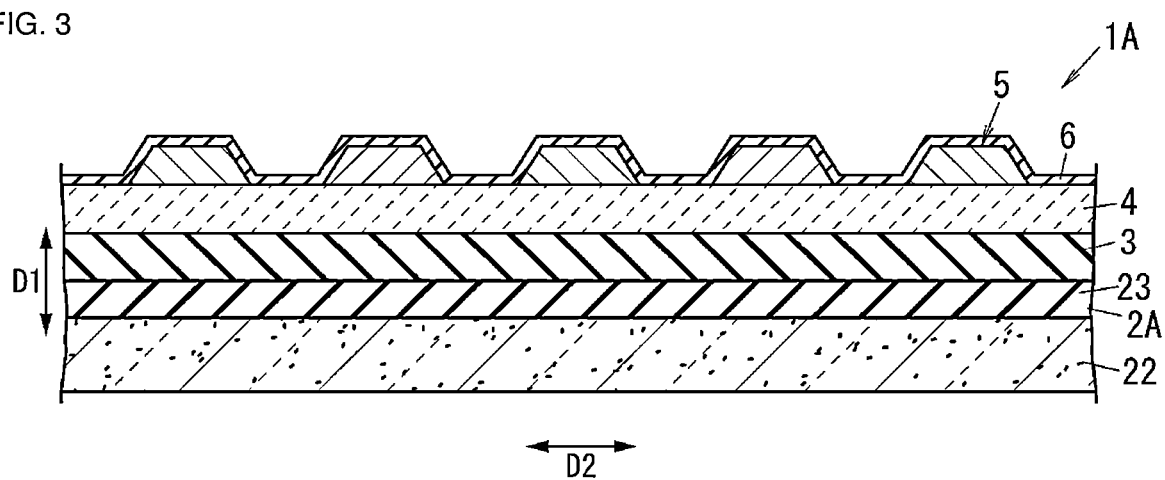
FIG. 3 is a sectional view of an acoustic wave device according to Modification 1 of a preferred embodiment of the present invention.

Acoustic wave devices according to preferred embodiments of the present invention are described below with reference to the drawings. FIG. 1 and FIG. 3, which are referred to in the description of preferred embodiments and so forth, are both schematic drawings, and ratios in size and thickness of components in the drawings do not necessarily reflect actual dimensional ratios.

First Preferred Embodiment

(1) Overall Structure of Acoustic Wave Device

First, the overall structure of an acoustic wave device 1 according to a preferred embodiment of the present invention is described with reference to FIG. 1.

The acoustic wave device 1 according to the present preferred embodiment includes, as depicted in FIG. 1, a high-acoustic-velocity member 2, a low-acoustic-velocity film 3, a piezoelectric layer 4, an interdigital transducer (IDT) electrode 5, and a dielectric film 6. The high-acoustic-velocity member 2, the low-acoustic-velocity film 3, the piezoelectric layer 4, the IDT electrode 5, and the dielectric film 6 are stacked in this sequence in a first direction D1.

(2) Each Component of Acoustic Wave Device

Next, each component of the acoustic wave device 1 according to the present preferred embodiment is described with reference to FIG. 1.

(2.1) High-Acoustic-Velocity Member

The high-acoustic-velocity member 2 is positioned on the opposite side of the piezoelectric layer 4 from the IDT electrode 5 as depicted in FIG. 1. The high-acoustic-velocity member 2 is a high-acoustic-velocity support substrate 21 which supports the low-acoustic-velocity film 3, the piezoelectric layer 4, the IDT electrode 5, and the dielectric film 6. The acoustic velocity of a bulk wave propagating through the high-acoustic-velocity support substrate 21 is higher than the acoustic velocity of an acoustic wave propagating through the piezoelectric layer 4.

The shape of the high-acoustic-velocity support substrate 21 (high-acoustic-velocity member 2) in plan view (peripheral shape when the high-acoustic-velocity support substrate 21 is viewed in the first direction D1) is a rectangular shape, but is not limited to a rectangular shape but may be, for example, a square shape. The material of the high-acoustic-velocity support substrate 21 is, for example, silicon. The thickness of the high-acoustic-velocity support substrate 21 is, for example, about 120 µm. Note that the material of the high-acoustic-velocity support substrate 21 is not limited to silicon and may be a piezoelectric material such as silicon carbide, aluminum nitride, aluminum oxide, silicon carbide, silicon nitride, sapphire, lithium tantalate (LiTaO$_3$), lithium niobate (LiNbO$_3$), or quartz; any of various ceramics such as alumina, zirconia, cordierite, mullite, steatite, and forsterite; magnesia; diamond; a material containing any of the above materials as a main component; or a material containing a mixture of the above materials as a main component.

(2.2) Low-Acoustic-Velocity Film

The low-acoustic-velocity film 3 is provided, as depicted in FIG. 1, between the high-acoustic-velocity member 2 and the piezoelectric layer 4. The acoustic velocity of a bulk wave propagating through the low-acoustic-velocity film 3 is lower than the acoustic velocity of a bulk wave propagating through the piezoelectric layer 4. Because the low-acoustic-velocity film 3 is provided between the high-acoustic-velocity member 2 and the piezoelectric layer 4, the acoustic velocity of the acoustic wave is decreased. The energy of the acoustic wave essentially concentrates on a medium with low acoustic velocity. Therefore, the effect of trapping acoustic wave energy into the piezoelectric layer 4 and into the IDT electrode 5 where the acoustic wave is excited can be enhanced. As a result, compared with a case in which the low-acoustic-velocity film 3 is not provided, loss can be reduced and the Q factor can be increased.

The material of the low-acoustic-velocity film 3 is, for example, silicon oxide. The thickness of the low-acoustic-velocity film 3 is, for example, about 2.0λ or smaller, where λ is the wavelength of the acoustic wave defined by the electrode finger period of the IDT electrode 5. Note that the material of the low-acoustic-velocity film 3 is not limited to silicon oxide but may be glass, silicon oxynitride, tantalum oxide, a compound with fluorine, carbon, or boron added to silicon oxide, or a material containing any of the above materials as a main component.

When the material of the low-acoustic-velocity film 3 is silicon oxide, frequency-temperature characteristics can be improved, compared with a case in which the low-acoustic-velocity film 3 is not included. The elastic constant of lithium tantalate has negative temperature characteristics, and the elastic constant of silicon oxide has positive temperature characteristics. Therefore, in the acoustic wave device 1, the absolute value of temperature coefficient of frequency (TCF) can be decreased.

Note that an adhesion layer may be provided between the low-acoustic-velocity film 3 and the piezoelectric layer 4. This can prevent the occurrence of peeling between the low-acoustic-velocity film 3 and the piezoelectric layer 4. The material of the adhesion layer is, for example, a resin (epoxy resin, polyimide resin, or the like), a metal, or the like. Also, besides the adhesion layer, a dielectric film may be provided between the low-acoustic-velocity film 3 and the piezoelectric layer 4 or below the low-acoustic-velocity film 3.

(2.3) Piezoelectric Layer

The piezoelectric layer 4 is located on the low-acoustic-velocity film 3. Herein, "located on the low-acoustic-velocity film 3" includes a case in which it is located directly on the low-acoustic-velocity film 3 and a case in which it is located indirectly on the low-acoustic-velocity film 3. The material of the piezoelectric layer 4 is, for example, lithium tantalate. Note that the material of the piezoelectric layer 4 is not limited to lithium tantalate but may be lithium niobate, zinc oxide (ZnO), aluminum nitride (AlN), or lead zirconate titanate (PZT).

The thickness (film thickness) of the piezoelectric layer 4 is preferably about 3.5λ or smaller, for example, where λ is the wavelength of the acoustic wave defined by the electrode finger period of the IDT electrode 5. When the thickness of the piezoelectric layer 4 is about 3.5λ or smaller, the Q factor is increased. Also, when the thickness of the piezoelectric layer 4 is about 2.5λ or smaller, the frequency-temperature characteristics are improved. Furthermore, when the thickness of the piezoelectric layer 4 is about 1.5λ or smaller, the acoustic velocity is easily adjusted.

(2.4) IDT Electrode

The IDT electrode 5 is located on the piezoelectric layer 4. Herein, "located on the piezoelectric layer 4" includes a case in which it is located directly on the piezoelectric layer 4 and a case in which it is located indirectly on the piezoelectric layer 4.

The IDT electrode 5 includes a plurality of electrode fingers and two busbars. The plurality of electrode fingers are aligned in a second direction D2 crossing (orthogonal to) the first direction D1. The two busbars are each preferably have an elongated shape, with the second direction D2 being the longitudinal direction, and are electrically connected to the plurality of electrode fingers. More specifically, the plurality of electrode fingers include a plurality of first electrode fingers and a plurality of second electrode fingers. The plurality of first electrode fingers are electrically connected to a first busbar of the two busbars. The plurality of second electrode fingers are electrically connected to a second busbar of the two busbars.

The material of the IDT electrode 5 is, for example, aluminum (Al). Note that the material of the IDT electrode 5 is not limited to aluminum but may be copper (Cu), platinum (Pt), gold (Au), silver (Ag), titanium (Ti), nickel (Ni), chromium (Cr), molybdenum (Mo), tungsten (W), tantalum (Ta), magnesium (Mg), iron (Fe), an alloy containing any of these metals as a main component, or the like. Also, the IDT electrode 5 may have a structure in which a plurality of metal films made of any of these metals or alloys are stacked.

In the present preferred embodiment, an adhesion layer is provided between the piezoelectric layer 4 and the IDT electrode 5. The material of the adhesion layer is, for example, titanium. This can prevent occurrence of peeling between the piezoelectric layer 4 and the IDT electrode 5. Note that the material of the adhesion layer is not limited to titanium but may be a resin (epoxy resin, polyimide resin, or the like), a metal other than titanium, or the like.

(2.5) Dielectric Film

The dielectric film 6 is located on the piezoelectric layer 4 so as to cover the IDT electrode 5. Herein, "located on the piezoelectric layer 4" includes a case in which it is located directly on the piezoelectric layer 4 and a case in which it is located indirectly on the piezoelectric layer 4. In the present preferred embodiment, the dielectric film 6 is a protective film which protects the IDT electrode 5, and preferably has a constant or substantially constant thickness (film thickness) along the shape of the IDT electrode 5. The dielectric film 6 has electrical insulation properties. The material of the dielectric film 6 is, for example, silicon oxide. That is, in the present preferred embodiment, the material of the dielectric film 6 and the material of the low-acoustic-velocity film 3 are identical, for example. Note that the material of the dielectric film 6 is not limited to silicon oxide but may be, for example, silicon nitride or an appropriate insulating material other than silicon oxide and silicon nitride.

(3) Characteristics of Acoustic Wave Device

Next, the characteristics of the acoustic wave device 1 according to the present preferred embodiment is described with reference to FIG. 2.

Figure 2:
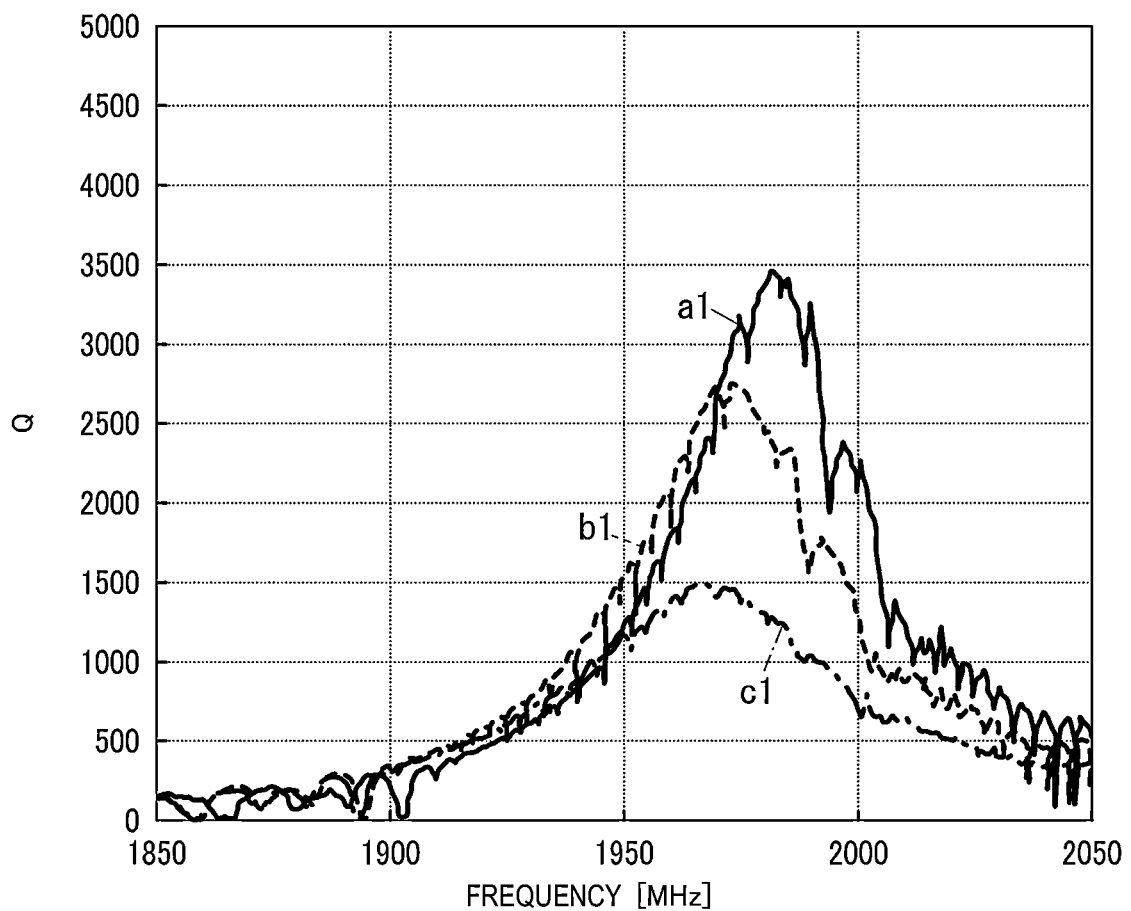
FIG. 2 is a graph depicting Q characteristics of the above acoustic wave device.

FIG. 2 is a graph depicting a relation between frequency and the Q factor in the acoustic wave device 1 according to the present preferred embodiment. In FIG. 2, the horizontal axis represents frequency, and the vertical axis represents the Q factor. Also in FIG. 2, characteristics obtained when the Young's modulus of the dielectric film 6 is larger than the Young's modulus of the low-acoustic-velocity film 3 are represented by a solid line a1, and characteristics obtained when the Young's modulus of the dielectric film 6 and the Young's modulus of the low-acoustic-velocity film 3 are similar are represented by a solid line b1. Furthermore in FIG. 2, characteristics obtained when the Young's modulus of the dielectric film 6 is smaller than the Young's modulus of the low-acoustic-velocity film 3 are represented by a one-dot-chain line c1.

From FIG. 2, it can be seen that the Q factor is the worst when the Young's modulus of the dielectric film 6 is smaller than the Young's modulus of the low-acoustic-velocity film 3 (one-dot-chain line c1) and the Q factor is the best when the Young's modulus of the dielectric film 6 is larger than the Young's modulus of the low-acoustic-velocity film 3 (solid line a1). That is, when the Young's modulus of the dielectric film 6 is larger than the Young's modulus of the low-acoustic-velocity film 3, the Q factor of the acoustic wave device 1 can be improved.

As in the acoustic wave device 1 according to the present preferred embodiment, when the dielectric film 6 which covers the IDT electrode 5 is included, as described above, the Q factor varies with the Young's modulus of the dielectric film 6. In this acoustic wave device 1, acoustic wave energy concentrates not only on the piezoelectric layer 4 but also on the dielectric film 6. Viscosity loss of the dielectric film 6 greatly contributes to loss of acoustic wave energy. Therefore, to decrease loss of acoustic wave energy, viscosity loss of the dielectric film 6 is preferably decreased as much as possible. Here, as the Young's modulus is increased, viscosity loss is decreased. Thus, to decrease loss of acoustic wave energy, the Young's modulus of the dielectric film 6 is preferably increased as much as possible.

Meanwhile, as described above, the acoustic velocity of the bulk wave propagating through the low-acoustic-velocity film 3 is lower than the acoustic velocity of the bulk wave propagating through the piezoelectric layer 4, and the acoustic velocity is required to be smaller than that in the piezoelectric layer 4. Thus, the Young's modulus of the low-acoustic-velocity film 3 is preferably smaller than the Young's modulus of the piezoelectric layer 4.

Thus, in this case, when the Young's modulus of the dielectric film 6 is larger than the Young's modulus of the low-acoustic-velocity film 3, loss of acoustic wave energy can be reduced (improved).

(4) Film Formation Conditions

Film formation conditions of the low-acoustic-velocity film 3 and the dielectric film 6 of the acoustic wave device 1 according to the present preferred embodiment are described below.

In the acoustic wave device 1 according to the present preferred embodiment, the low-acoustic-velocity film 3 and the dielectric film 6 are formed by, for example, sputtering. In this case, by changing the degree of vacuum in a chamber of a sputter device, the Young's moduli of the low-acoustic-velocity film 3 and the dielectric film 6 can be controlled. For example, when the low-acoustic-velocity film 3 is formed, if the degree of vacuum in the chamber is set to about 0.5 Pa or larger and about 1.0 Pa or smaller, a low-acoustic-velocity film 3 with a small Young's modulus compared with that of the dielectric film 6 can be formed. Also, when the dielectric film 6 is formed, if the degree of vacuum in the chamber is set to about 0.04 Pa or larger and about 0.1 Pa or smaller, a dielectric film 6 with a large Young's modulus compared with that of the low-acoustic-velocity film 3 can be provided. That is, if the degree of vacuum is increased (the ultimate pressure of residual gas in the chamber is decreased), impurities in the formed film are decreased, and a film with high purity and density of atoms can be acquired. Thus, the film has large Young's modulus and small viscosity loss. That is, in the acoustic wave device 1 according to the present preferred embodiment, by adjusting the degree of vacuum in the chamber, the Young's modulus of the dielectric film 6 can be made larger than the Young's modulus of the low-acoustic-velocity film 3.

(5) Effects

As described above, the acoustic wave device 1 according to the present preferred embodiment includes the piezoelectric layer 4, the IDT electrode 5, the high-acoustic-velocity member 2, the low-acoustic-velocity film 3, and the dielectric film 6. The IDT electrode 5 is located on the piezoelectric layer 4. The high-acoustic-velocity member 2 is positioned on an opposite side of the piezoelectric layer 4 from the IDT electrode 5. An acoustic velocity of a bulk wave propagating through the high-acoustic-velocity member 2 is higher than an acoustic velocity of an acoustic wave propagating through the piezoelectric layer 4. The low-acoustic-velocity film 3 is provided between the high-acoustic-velocity member 2 and the piezoelectric layer 4. An acoustic velocity of a bulk wave propagating through the low-acoustic-velocity film 3 is lower than the acoustic velocity of the bulk wave propagating through the piezoelectric layer 4. The dielectric film 6 is located on the piezoelectric layer 4 so as to cover the IDT electrode 5. In this acoustic wave device 1, a Young's modulus of the dielectric film 6 is larger than a Young's modulus of the low-acoustic-velocity film 3.

In the structure in which the IDT electrode 5 is covered with the dielectric film 6, acoustic wave energy concentrates not only on the piezoelectric layer 4 but also on the dielectric film 6. Thus, when the Young's modulus of the dielectric film 6 is increased as much as possible, viscosity loss of the dielectric film 6 can be decreased, thereby allowing loss of acoustic wave energy to be reduced. Here, as the Young's modulus of the low-acoustic-velocity film 3 becomes smaller, loss can be further reduced or prevented. Therefore, when the Young's modulus of the dielectric film 6 is larger than the Young's modulus of the low-acoustic-velocity film 3, loss can be further reduced or prevented.

In the acoustic wave device 1 according to the present preferred embodiment, the material of the dielectric film 6 is silicon oxide. This can improve frequency-temperature characteristics compared with a case in which the material of the dielectric film 6 is not silicon oxide.

In the acoustic wave device 1 according to the present preferred embodiment, the material of the low-acoustic-velocity film 3 is silicon oxide. This can improve frequency-temperature characteristics compared with a case in which the material of the low-acoustic-velocity film 3 is not silicon oxide.

In the acoustic wave device 1 according to the present preferred embodiment, the material of the dielectric film 6 and the material of the low-acoustic-velocity film 3 are identical. This provides the advantage that the Young's modulus of the dielectric film 6 is easily adjusted, compared with a case in which the material of the dielectric film 6 and the material of the low-acoustic-velocity film 3 are different.

In the acoustic wave device 1 according to the preferred embodiment, the high-acoustic-velocity member 2 is the high-acoustic-velocity support substrate 21, and the acoustic velocity of the bulk wave propagating therethrough is higher than the acoustic velocity of the acoustic wave propagating through the piezoelectric layer 4. This can increase the Q factor of the acoustic wave device 1.

(6) Modifications

The above-described preferred embodiments are merely examples of various preferred embodiments of the present invention. The above-described preferred embodiments can be variously changed in accordance with design and so forth as desired or needed. Example modifications of the above-described preferred embodiments are listed below. The modifications described below can be applied in any suitable combination.

(6.1) Modification 1

While the acoustic wave device 1 according to a preferred embodiment of the present invention has a three-layer structure having the high-acoustic-velocity support substrate 21, the low-acoustic-velocity film 3, and the piezoelectric layer 4, an acoustic wave device 1A according to Modification 1 has a four-layer structure and in this point, they are different. The structure of the acoustic wave device 1A having the four-layer structure is described below with reference to FIG. 3. Note that in the acoustic wave device 1A according to Modification 1, components similar to those of the acoustic wave device 1 according to the preferred embodiments are provided with the same reference characters and their description is omitted.

The acoustic wave device 1A according to Modification 1 includes, as depicted in FIG. 3, a high-acoustic-velocity member 2A, the low-acoustic-velocity film 3, the piezoelectric layer 4, the IDT electrode 5, and the dielectric film 6. The high-acoustic-velocity member 2A includes a support substrate 22 and a high-acoustic-velocity film 23. That is, the acoustic wave device 1A further includes the support substrate 22. The high-acoustic-velocity film 23 is located on the support substrate 22. Herein, "located on the support substrate 22" includes a case in which it is located directly on the support substrate 22 and a case in which it is located indirectly on the support substrate 22. The acoustic velocity of a bulk wave propagating through the high-acoustic-velocity film 23 is higher than the acoustic velocity of an acoustic wave propagating through the piezoelectric layer 4.

Note that the acoustic wave device 1A may have an adhesion layer, a dielectric film, and so forth, in addition to the high-acoustic-velocity film 23, the low-acoustic-velocity film 3, the piezoelectric layer 4, and the dielectric film 6.

The material of the support substrate 22 is, for example, silicon. Note that the material of the support substrate 22 is not limited to silicon but may be a piezoelectric material such as sapphire, lithium tantalate, lithium niobate, or quartz; any of various ceramics such as alumina, magnesia, silicon nitride, aluminum nitride, silicon carbide, zirconia, cordierite, mullite, steatite, and forsterite; a dielectric such as glass; a semiconductor such as gallium nitride; a resin; or the like.

The high-acoustic-velocity film 23 is located on the support substrate 22. The high-acoustic-velocity film 23 functions to trap the acoustic wave into a portion where the piezoelectric layer 4 and the low-acoustic-velocity film 3 are stacked and prevent the acoustic wave from leaking to the structure below the high-acoustic-velocity film 23. As for the thickness of the high-acoustic-velocity film 23, a thicker film is desirable in view of the function of trapping the acoustic wave into the piezoelectric layer 4 and the low-acoustic-velocity film 3.

When the thickness of the high-acoustic-velocity film 23 is sufficiently thick, acoustic wave energy in a specific example for use to acquire characteristics of a filter or a resonator is distributed over the entire piezoelectric layer 4 and low-acoustic-velocity film 3 and is also distributed to a portion of the high-acoustic-velocity film 23 on the low-acoustic-velocity film 3 side, but is not distributed to the support substrate 22. A mechanism of trapping the acoustic wave by the high-acoustic-velocity film 23 is a mechanism similar to that for a Love-wave-type surface acoustic wave, which is a non-leaky SH wave, and is described in, for example, "Introduction to Simulation Technologies for Surface Acoustic Wave Devices", Kenya Hashimoto, REALIZE Science & Engineering, pp. 26-28. The above-described mechanism is different from a mechanism of trapping an acoustic wave by using a Bragg reflector with an acoustic multilayer film.

The material of the high-acoustic-velocity film 23 is, for example, at least one material selected from the group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond.

According to the acoustic wave device 1A of Modification 1, as with the acoustic wave device 1 according to the above-described preferred embodiments, the Young's modulus of the dielectric film 6 is larger than the Young's modulus of the low-acoustic-velocity film 3, thereby allowing a decrease in viscosity loss of the dielectric film 6. This can reduce loss of acoustic wave energy. Also, according to the acoustic wave device 1A of Modification 1, the Q factor can also be increased.

(6.2) Other Modifications

Other modifications are listed below.

While the material of the dielectric film 6 and the material of the low-acoustic-velocity film 3 are identical in the preferred embodiments and Modification 1, the material of the dielectric film 6 and the material of the low-acoustic-velocity film 3 may be different if the Young's modulus of the dielectric film 6 is larger than the Young's modulus of the low-acoustic-velocity film 3. However, if the material of the dielectric film 6 and the material of the low-acoustic-velocity film 3 are identical, there is the advantage that the Young's modulus of the dielectric film 6 can be adjusted only by, for example, changing pressure, temperature, or the like, and the Young's modulus is easily adjusted.

In the preferred embodiments and Modification 1, the dielectric film 6 is provided to correspond to the shape of the IDT electrode 5, and the thickness (film thickness) of the dielectric film 6 is constant or substantially constant over the entire surface of the piezoelectric layer 4. However, it is not necessary that the thickness of the dielectric film 6 be constant, and the dielectric film 6 may be formed so that, for example, the thickness of the dielectric film 6 from a principal surface of the piezoelectric layer 4 on the IDT electrode 5 side is constant or substantially constant.

In the preferred embodiments, by changing the degree of vacuum in the chamber, the Young's moduli of the low-acoustic-velocity film 3 and the dielectric film 6 are controlled. However, for example, the Young's moduli of the low-acoustic-velocity film 3 and the dielectric film 6 may be controlled by changing temperature in the chamber, or the Young's moduli of the low-acoustic-velocity film 3 and the dielectric film 6 may be controlled by changing both of the degree of vacuum and temperature in the chamber. Furthermore, the Young's moduli of the low-acoustic-velocity film 3 and the dielectric film 6 may be controlled by changing a condition other than the degree of vacuum and temperature in the chamber.

SUMMARY

From the preferred embodiments and others described above, the following non-limiting examples are disclosed.

An acoustic wave device (1; 1A) according to a first example includes a piezoelectric layer (4), an IDT electrode (5), a high-acoustic-velocity member (2; 2A), a low-acoustic-velocity film (3), and a dielectric film (6). The IDT electrode (5) is located on the piezoelectric layer (4). The high-acoustic-velocity member (2; 2A) is positioned on an opposite side of the piezoelectric layer (4) from the IDT electrode (5). An acoustic velocity of a bulk wave propagating through the high-acoustic-velocity member (2; 2A) is higher than an acoustic velocity of an acoustic wave propagating through the piezoelectric layer (4). The low-acoustic-velocity film (3) is provided between the high-acoustic-velocity member (2; 2A) and the piezoelectric layer (4). An acoustic velocity of a bulk wave propagating through the low-acoustic-velocity film (3) is lower than the acoustic velocity of the bulk wave propagating through the piezoelectric layer (4). The dielectric film (6) is located on the piezoelectric layer (4) so as to cover the IDT electrode (5). In the acoustic wave device (1; 1A), a Young's modulus of the dielectric film (6) is larger than a Young's modulus of the low-acoustic-velocity film (3).

According to this example, loss of acoustic wave energy can be reduced compared with a case in which the Young's modulus of the dielectric film (6) is smaller than or equal to the Young's modulus of the low-acoustic-velocity film (3).

In the acoustic wave device (1; 1A) according to a second example, in the first example, the material of the dielectric film (6) is silicon oxide.

According to this example, frequency-temperature characteristics can be improved compared with a case in which the material of the dielectric film (6) is not silicon oxide.

In the acoustic wave device (1; 1A) according to a third example, in the first or second example, the material of the low-acoustic-velocity film (3) is silicon oxide.

According to this example, frequency-temperature characteristics can be improved compared with a case in which the material of the low-acoustic-velocity film (3) is not silicon oxide.

In the acoustic wave device (1; 1A) according to a fourth example, in the first example, the material of the dielectric film (6) and the material of the low-acoustic-velocity film (3) are identical.

According to this example, there is the advantage that the Young's modulus of the dielectric film (6) is easily adjusted, compared with a case in which the material of the dielectric film (6) and the material of the low-acoustic-velocity film (3) are different.

In the acoustic wave device (1) according to a fifth example, in any one of the first to fourth examples, the high-acoustic-velocity member (2) is a high-acoustic-velocity support substrate (21), and an acoustic velocity of a bulk wave propagating through the high-acoustic-velocity support substrate (21) is higher than the acoustic velocity of the acoustic wave propagating through the piezoelectric layer (4).

According to this example, the Q factor of the acoustic wave device (1) can be increased.

The acoustic wave device (1A) according to a sixth example further includes a support substrate (22) in any one of the first to fourth examples. The high-acoustic-velocity member (2A) is located on the support substrate (22) and includes a high-acoustic-velocity film (23), and an acoustic velocity of a bulk wave propagating through the high-acoustic-velocity film (23) is higher than the acoustic velocity of the acoustic wave propagating through the piezoelectric layer (4).

According to this example, the Q factor of the acoustic wave device (1A) can be increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
   a piezoelectric layer;
   an interdigital transducer (IDT) electrode located on the piezoelectric layer;
   a high-acoustic-velocity member positioned on an opposite side of the piezoelectric layer from the IDT electrode such that an acoustic velocity of a bulk wave propagating through the high-acoustic-velocity member is higher than an acoustic velocity of an acoustic wave propagating through the piezoelectric layer;
   a low-acoustic-velocity film provided between the high-acoustic-velocity member and the piezoelectric layer such that an acoustic velocity of a bulk wave propagating through the low-acoustic-velocity film is lower than the acoustic velocity of the bulk wave propagating through the piezoelectric layer; and
   a dielectric film located on the piezoelectric layer so as to cover the IDT electrode; wherein
   a Young's modulus of the dielectric film is larger than a Young's modulus of the low-acoustic-velocity film; and
   a material of the dielectric film is silicon oxide.
2. The acoustic wave device according to claim 1, wherein a material of the low-acoustic-velocity film is silicon oxide.

3. The acoustic wave device according to claim 2, wherein
the high-acoustic-velocity member is a high-acoustic-velocity support substrate; and
an acoustic velocity of a bulk wave propagating through the high-acoustic-velocity support substrate is higher than the acoustic velocity of the acoustic wave propagating through the piezoelectric layer.

4. The acoustic wave device according to claim 2, further comprising:
a support substrate; wherein
the high-acoustic-velocity member is located on the support substrate and includes a high-acoustic-velocity film such that an acoustic velocity of a bulk wave propagating through the high-acoustic-velocity film is higher than the acoustic velocity of the acoustic wave propagating through the piezoelectric layer.

5. The acoustic wave device according to claim 1, wherein
the high-acoustic-velocity member is a high-acoustic-velocity support substrate; and
an acoustic velocity of a bulk wave propagating through the high-acoustic-velocity support substrate is higher than the acoustic velocity of the acoustic wave propagating through the piezoelectric layer.

6. The acoustic wave device according to claim 1, further comprising:
a support substrate; wherein
the high-acoustic-velocity member is located on the support substrate and includes a high-acoustic-velocity film such that an acoustic velocity of a bulk wave propagating through the high-acoustic-velocity film is higher than the acoustic velocity of the acoustic wave propagating through the piezoelectric layer.

7. An acoustic wave device comprising:
a piezoelectric layer;
an interdigital transducer (IDT) electrode located on the piezoelectric layer;
a high-acoustic-velocity member positioned on an opposite side of the piezoelectric layer from the IDT electrode such that an acoustic velocity of a bulk wave propagating through the high-acoustic-velocity member is higher than an acoustic velocity of an acoustic wave propagating through the piezoelectric layer;
a low-acoustic-velocity film provided between the high-acoustic-velocity member and the piezoelectric layer such that an acoustic velocity of a bulk wave propagating through the low-acoustic-velocity film is lower than the acoustic velocity of the bulk wave propagating through the piezoelectric layer; and
a dielectric film located on the piezoelectric layer so as to cover the IDT electrode; wherein
a Young's modulus of the dielectric film is larger than a Young's modulus of the low-acoustic-velocity film; and
a material of the dielectric film and a material of the low-acoustic-velocity film are identical.

8. The acoustic wave device according to claim 7, wherein
the high-acoustic-velocity member is a high-acoustic-velocity support substrate; and
an acoustic velocity of a bulk wave propagating through the high-acoustic-velocity support substrate is higher than the acoustic velocity of the acoustic wave propagating through the piezoelectric layer.

9. The acoustic wave device according to claim 7, further comprising:
a support substrate; wherein
the high-acoustic-velocity member is located on the support substrate and includes a high-acoustic-velocity film such that an acoustic velocity of a bulk wave propagating through the high-acoustic-velocity film is higher than the acoustic velocity of the acoustic wave propagating through the piezoelectric layer.

* * * * *